United States Patent [19]

Maruyama

[11] Patent Number: 5,570,058
[45] Date of Patent: Oct. 29, 1996

[54] SIGNAL LINE TESTING CIRCUIT CAUSING NO DELAY IN TRANSMISSION OF A NORMAL DATA SIGNAL

[75] Inventor: Shigeru Maruyama, Kanagawa, Japan

[73] Assignee: NEC Corporation, Tokyo, Japan

[21] Appl. No.: 443,013

[22] Filed: May 17, 1995

[30] Foreign Application Priority Data

May 17, 1994 [JP] Japan .................................. 6-102512

[51] Int. Cl.$^6$ .............................................. H03K 17/693
[52] U.S. Cl. ......................... 327/404; 327/407; 327/108; 326/16
[58] Field of Search ................................ 327/52, 53, 65, 327/66, 327, 560, 563, 99, 321, 328, 403, 404, 407, 408, 108, 427; 326/16

[56] References Cited

U.S. PATENT DOCUMENTS 4,739,198  4/1988  Maruyama ............................... 327/52
5,331,206  7/1994  Liron ..................................... 327/403

Primary Examiner—Timothy P. Callahan
Assistant Examiner—Terry L. Englund
Attorney, Agent, or Firm—Sughrue, Mion, Zinn, Macpeak & Seas

[57] ABSTRACT

A signal line switching circuit includes a switching and driving circuit connected in parallel to a pair of complementary signal lines to be switch-controlled and having a current supply capability sufficiently larger than that of an amplifier having its pair of complementary outputs connected to the pair of complementary signal lines. The switching and driving circuit can supply onto at least one of the pair of complementary signal lines a signal which is independent of a level of the outputs of the amplifier and which corresponds to a test discrimination result signal.

7 Claims, 3 Drawing Sheets

SIGNAL LINE TESTING CIRCUIT CAUSING NO DELAY IN TRANSMISSION OF A NORMAL DATA SIGNAL

BACKGROUND OF THE INVENTION

1. Field of the Invention

The present invention relates to a signal line switching circuit, and more specifically to a signal line switching circuit in a semiconductor integrated circuit with a test circuit.

2. Description of Related Art

With a large scaling of semiconductor integrated circuits, a test for checking whether or not various circuits included in the integrated circuit can operate properly has become important. As one means for making the test easy in a large scaled integrated circuit such as a static random access memory (SRAM), many integrated circuits have incorporated therein a signal switching circuit for selecting either a data signal in a normal operation (called a "normal-data signal" hereinafter) or a test signal, in order to investigate existence/non-existence of failure before the integrated circuit is put in a normal operation condition.

In the prior art, this type of signal switching circuit has been used in sense amplifiers of the SRAM, and has been constituted of transfer gates or clocked inverters.

Referring to FIG. 1, there is shown a block diagram of a first example of the conventional signal switching circuit using a set of transfer gates. The shown first signal switching circuit includes a first stage amplifier A1 receiving a pair of complementary normal-data signals "a" and "Ia" having a small amplitude, and outputting a pair of amplified signals "b" and "Ib" on a pair of signal lines "B 1" and "B2". The first signal switching circuit also includes a switching circuit 1 responding to a pair of complementary normal-dam/test selection signals "m" and "Im" so as to select either the signals "b" and "Ib" or a pair of complementary test discrimination result signals "t" and "It" from a test circuit (not shown), and to output a pair of selected signals "c" and "Ic". Furthermore, the first signal switching circuit includes a second stage amplifier A2 receiving and amplifying the pair of selected signals "c" and "Ic" to output a pair of amplified signals "d" and "Id", and an output circuit 6 converting the pair of amplified signals "d" and "Id" into an output signal "e" of a predetermined signal type.

The switching circuit 1 includes a pair of NMOS (N-channel metal- oxide-semiconductor field effect) transistors N11 and N12 having their source connected to receive the signals "b" and "Ib", respectively, and their gate connected in common to receive the normal-data selection signal "m", and also their dram connected to supply the received signals "b" and "Ib" as the selected signals "c" and "Ic", respectively. The switching circuit 1 also includes another pair of NMOS transistors N13 and N14 having their source connected to receive the pair of test discrimination result signals "t" and "It", respectively, and their gate connected in common to receive the test selection signal "Im", and also their drain connected to supply the received signals "t" and "It" as the selected signals "c" and "Ic", respectively.

Now, operation of the first conventional signal switching circuit will be described with reference to FIG. 1. When the normal-data signal is to be outputted, the normal-data/test selection signals "m" and "Im" are set to a high level and to a low level, respectively. The pair of complementary normal-data signals "a" and "Ia" are amplified by the amplifier A1 so as to be outputted as the signals "b" and "Ib", respectively. In response to the normal-data selection signal "m" of the high level, the transistors N11 and N12 are put in a conductive condition, so that the signals "b" and "Ib" pass through the transistors N11 and N12 as they are, and are supplied to the amplifier A2 as the selected signals "c" and "Ic". On the other hand, in response to the test selection signal "Im" of the low level, the transistors N13 and N14 are put in a non-conductive condition, and therefore, the test discrimination result signals "t" and "It" are blocked, so that the signals "c" and "Ic" are not influenced by the test discrimination result signals "t" and "It" at all. The signals "c" and "Ic" are amplified by the amplifier A2, which outputs the amplified signals "d" and "Id" to the output circuit 6, which then supplies the output signal "e".

When the test discrimination result signal is to be outputted, the normal-data/test selection signals "m" and "Im" are set to a low level and to a high level, respectively, in the contrary to the case of outputting the normal-data signal. In response to the test selection signal "Im" of the high level, the transistors N13 and N14 are put in a conductive condition, so that the test discrimination result signals "t" and "It" pass through the transistors N13 and N14 as they are, and are supplied to the amplifier A2 as the selected signals "c" and "Ic". On the other hand, in response to the normal-data selection signal "m" of the low level, the transistors N11 and N12 are put in a non-conductive condition, and therefore, the amplified complementary normal-data signals "b" and "Ib" are blocked. As a result, the signals "c" and "Ic" corresponding to the test discrimination result signals "t" and "It" are amplified by the amplifier A2, which outputs the amplified signals "d" and "Id" to the output circuit 6, which then supplies the output signal "e". In this case, the output signal "e" is indicative of the test discrimination result signals "t" and "It".

Thus, the transistors N11 to N14 of the switching circuit 1 functions as the transfer gate controlled by the normal-data/ test selection signals "m" and "Im".

Referring to FIG. 2, there is shown a block diagram of a second example of the conventional signal switching circuit using a set of clocked inverters. In FIG. 2, elements similar or corresponding to those shown in FIG. 1 are given the same Reference Numerals, and explanation thereof will be omitted for simplification of the description.

As seen from comparison between FIGS. 1 and 2, the second example of the conventional signal switching circuit is different from the first conventional signal switching circuit, in which a switching circuit 2 is provided which is constituted of a set of clocked inverters in place of the transfer gates of the switching circuit 1.

The switching circuit 2 includes a pair of clocked inverters I21 and I22 having their selection gate connected in common to receive the normal-data selection signal "m", and their input connected to receive the signals "b" and "Ib", respectively, and also their output for outputting the selected signals "c" and "Ic", respectively, and another pair of clocked inverters I23 and I24 having their selection gate connected in common to receive the test selection signal "Im", and their input connected to receive the test discrimination result signals "t" and "It", respectively, and also their output for outputting the selected signals "c" and "It", respectively, Operation of the second conventional signal switching circuit is the same as that of the first conventional signal switching circuit, excepting that the selected signals "c" and "Ic" are either the inverted signals of the signals "b" and "Ib", respectively, or the inverted signals of the test discrimination result signals "t" and "It", respectively.

In the first conventional signal switching circuit as mentioned above, it is necessary to enlarge the size of the MOS transistors in order to reduce a conduction resistance and a junction capacitance which are causes for lowering the transmission speed of the signals passing through the MOS transistors put in a transmission path of the normal-data as the transfer gate. In addition, each of the test discrimination result signal and the normal-data/test selection signal is a pair of complementary signals, which correspondingly require a pair of signal lines. Therefore, the chip size has become large.

In the second conventional signal switching circuit as mentioned above, a signal delay corresponding to an inverter of at least one stage occurs because of the clocked inverters inserted in the transmission path of the normal-data. In addition, the number of transistors required for constituting the four clocked inverters is 16, and each of the test discrimination result signal and the normal-data/test selection signal requires a pair of complementary signal lines, similarly to the first conventional signal switching circuit. Accordingly, the chip size has become large, similarly to the first conventional signal switching circuit.

SUMMARY OF THE INVENTION

Accordingly, it is an object of the present invention to provide a signal line switching circuit which has overcome the above mentioned defects of the conventional ones.

Another object of the present invention is to provide a signal line switching circuit having a reduced signal transmission delay, without increasing the chip size.

Still another object of the present invention is to provide a signal line switching circuit having a reduced number of signal lines for the test discrimination result signal and the normal-data/test selection signal, so as to require only a decreased chip size.

The above and other objects of the present invention are achieved in accordance with the present invention by a signal line switching circuit comprising:

- a first amplifying circuit receiving a data signal in a normal operation, for outputting first and second signals complementary to each other and having a first amplitude, onto first and second signal lines, respectively;
- a second amplifying circuit receiving the first and second signals on the first and second signal lines, for outputting a pair of complementary output signals having a second amplitude; and
- a switching and driving circuit connected in parallel to the first and second signal lines, and receiving a test discrimination result signal and responding to a test selection signal indicative of selection of a test operation, so as to supply on the first and second signal lines, third and fourth signals complementary to each other and corresponding to the test discrimination result signal, the switching and driving circuit having a current supply capacity so sufficiently larger than that of the first amplifying circuit as to be able to supply the third and fourth signals onto the first and second signal lines, respectively, independently of the level of the first and second signals.

The above and other objects, features and advantages of the present invention will be apparent from the following description of preferred embodiments of the invention with reference to the accompanying drawings.

DESCRIPTION OF THE PREFERRED EMBODIMENTS

Figure 2:
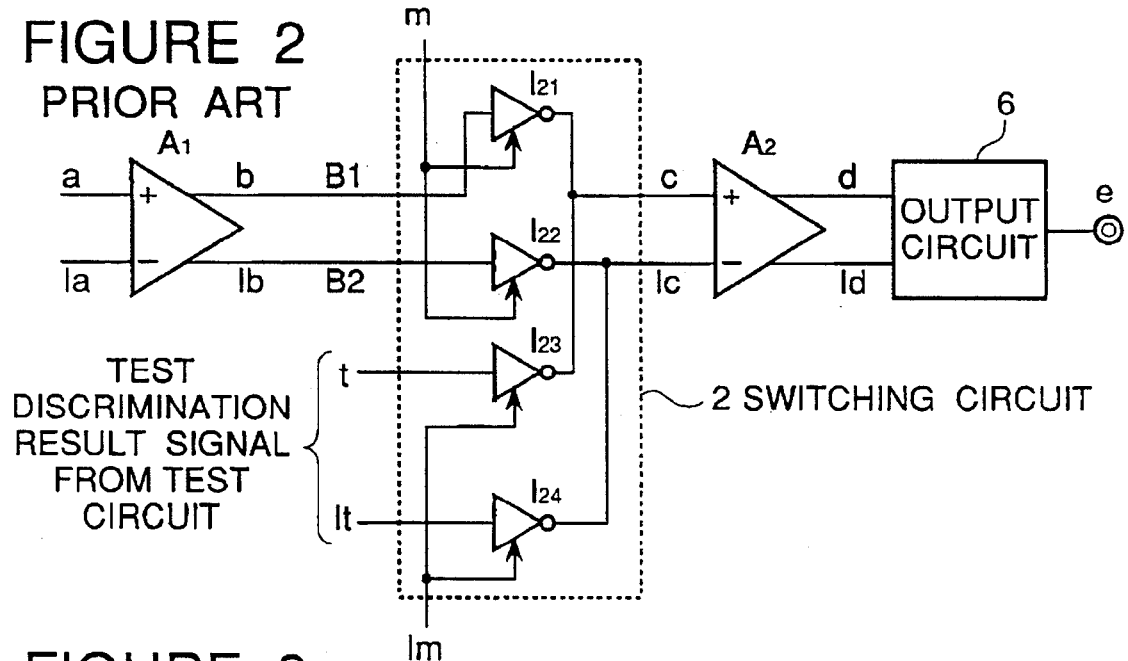
FIG. 2 is a block diagram of a second example of the conventional signal line switching circuit constituted of a set of clocked inverters.
Figure 3:
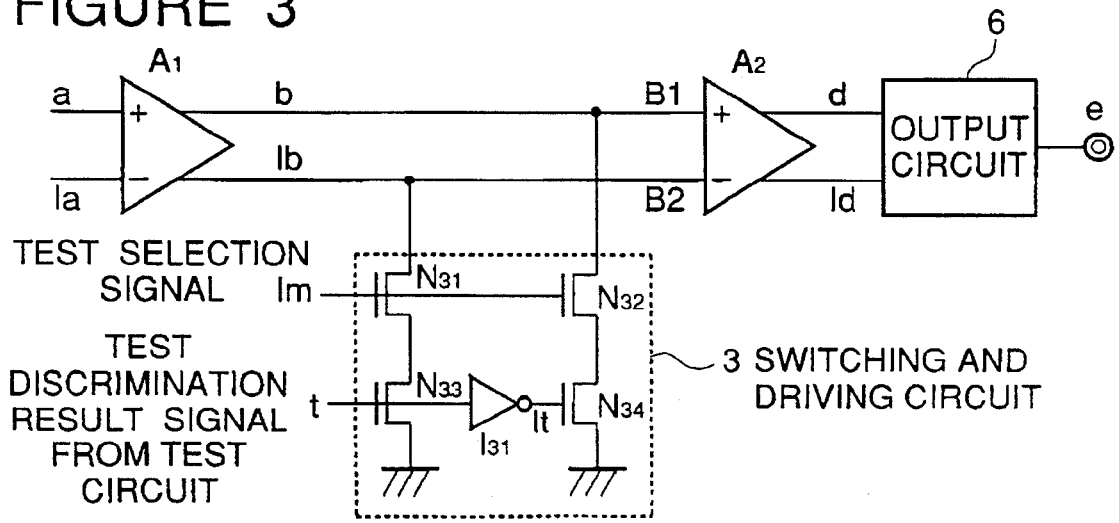
FIG. 3 is a block diagram of a first embodiment of the signal line switching circuit in accordance with the present invention.

Referring to FIG. 3, there is shown a block diagram of a first embodiment of the signal line switching circuit in accordance with the present invention. In FIG. 3, elements similar or corresponding to those shown in FIGS. 1 and 2 are given the same Reference Numerals, and explanation thereof will be omitted for simplification of the description.

Figure 1:
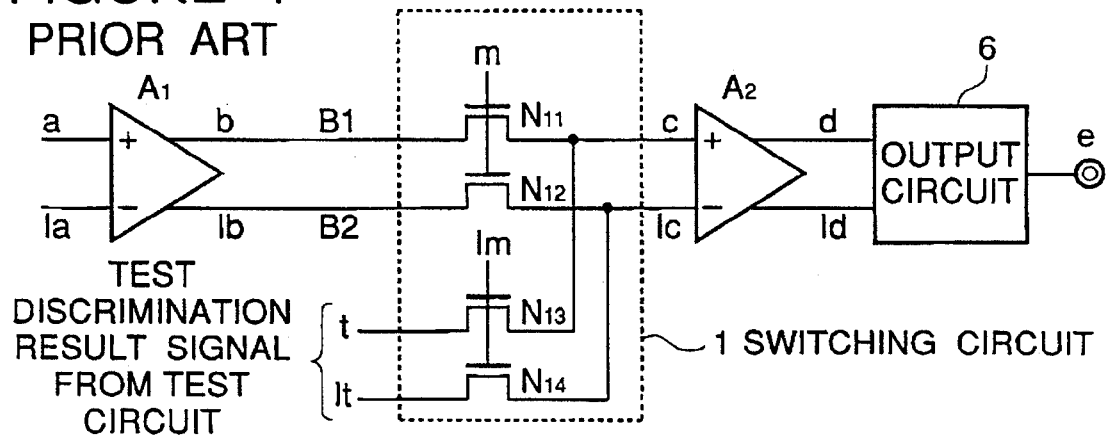
FIG. 1 is a block diagram of a first example of the conventional signal line switching circuit constituted of a set of transfer gates.

As seen from comparison between FIGS. 1 and 2 and FIG. 3, in addition to the common amplifiers A1 and A2 and the output circuit 6, the first embodiment includes, in place of the switching circuit 1 or 2, a switching and driving circuit 3 so configured as to respond to the test selection signal "Im" to forcibly bring the signals "b" and "Ib" on the signal lines B1 and B2 to signal levels corresponding to the test discrimination result signal "t". A pair of complementary outputs of the amplifier A1 are connected directly to the pair of complementary signal lines B1 and B2, which are in turn connected directly to the pair of complementary inputs of the amplifier A2. Therefore, in any situation, there occurs no delay in transferring the output of the amplifier A1 to the inputs of the amplifier A2.

The switching and driving circuit 3 includes a pair of NMOS transistors N31 and N32 having their gate connected in common to receive the test selection signal "Im" and their drain connected to the signal lines B2 and B1, respectively, a source-grounded NMOS transistor N33 having its gate connected to receive the test discrimination result signal "t" and its drain connected to a source of the NMOS transistor N31, an inverter I31 having its input connected to receive the test discrimination result signal "t" and its output for generating an inverted signal "It" of the test discrimination result signal "t", and another source-grounded NMOS transistor N34 having its gate connected to the output of the inverter I31 and its drain connected to a source of the NMOS transistor N32. The transistors N31 to N34 have a current supplying capability sufficiently larger than that of the amplifier A1. For example, the current supplying capability of the transistors N31 to N34 is not smaller than a double of the current supplying capability of the amplifier A1.

Figure 4A:
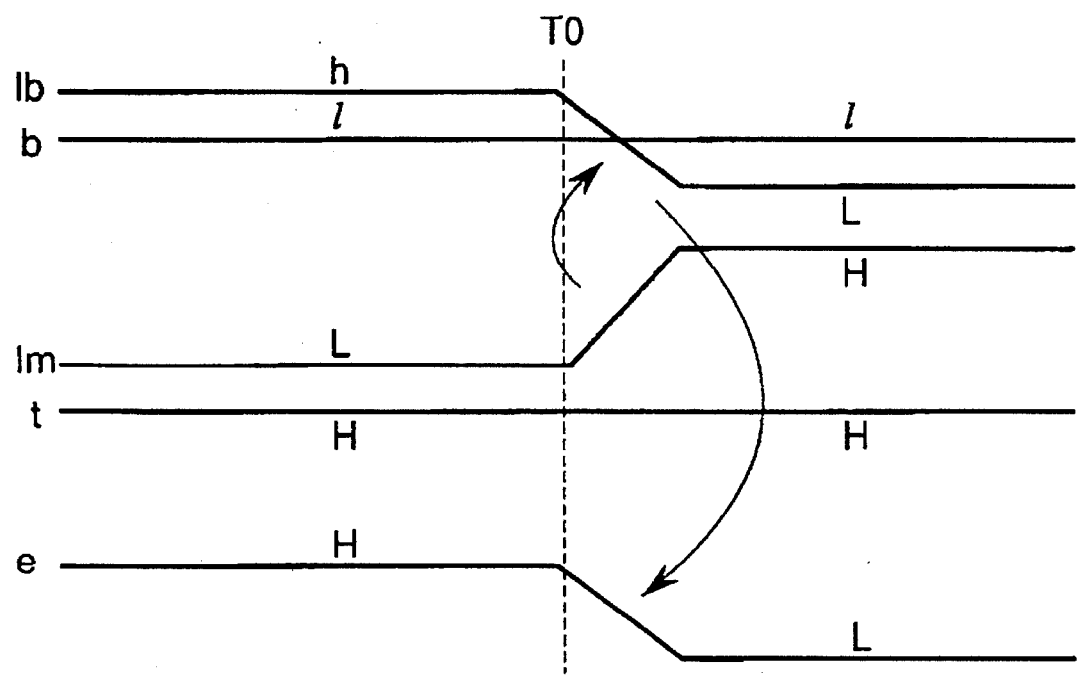
FIGS. 4A and 4B are timing charts illustrating the operation of the first embodiment of the signal line switching circuit shown in FIG. 3.
Figure 4B:
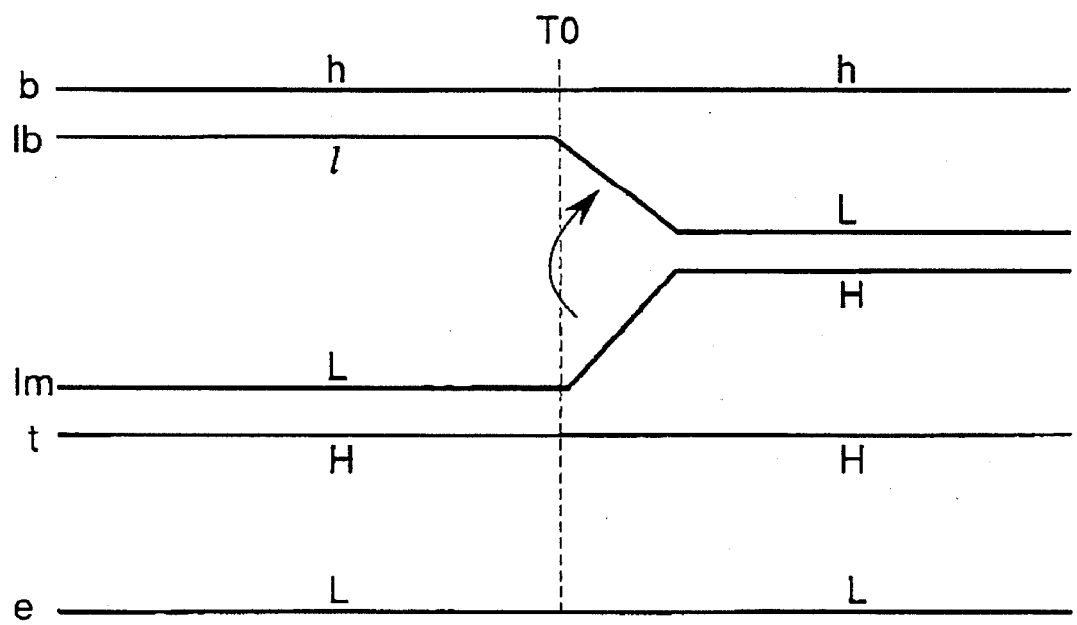

Now, operation of the first embodiment will be described with reference to FIG. 3 and the timing charts of FIGS. 4A and 4B illustrating one example of the operation of the first embodiment.

When the normal-data signal is to be outputted, the test selection signal "Im" is set or brought to a ground level, namely, a normal low level (L). The pair of normal-data signals "a" and "Ia" are amplified by the amplifier A1 so that the pair of complementary signals "b" and "Ib" having a small amplitude are outputted onto the pair of signal lines B1 and B2, respectively. Here, for convenience of explanation, it is assumed that as shown in FIG. 4A, when the normal-data signal is selected, the signal "Ib" is at a small-amplitude high level (h) which is lower than that of a normal high level (H), and the signal "b" is at a small-amplitude low level (l) which is higher than that of a normal low level (L). It is also assumed that the test discrimination result signal "t" is at the normal high level (H) and the output signal "e" is also at the normal high level (H).

In response to the low level of the test selection signal "Im", the transistors N31 and N32 are put into a non-conductive condition, and therefore, the test discrimination result signal "t" and its inverted signal "It" are blocked, so that the signals "b" and "Ib" on the signal lines B1 and B2 are not influenced by the test discrimination result signals "t" and "It". Therefore, the signals "b" and "Ib" which appear on the signal lines B1 and B2 and which correspond to the normal-data signals "a" and "Ia", are supplied without modification to the amplifier A2, which supplies a pair of amplified complementary signals "d" and "Id" to the output circuit 6, which in turn outputs the output signal "e" of the normal high level (H) indicative of the normal-data signals "a" and "Ia" supplied to the amplifier A1.

Next, when test discrimination result signal is to be outputted, the test selection signal "Im" is set or brought to a normal high level (H) (at a timing T0), in the contrary to the case of outputting the normal-data signal. In response to the high level of the test selection signal "Im", the transistors N31 and N32 are put into a conductive condition, and in response to the high level of the test discrimination result signal "t", the transistor N33 is put into a conductive condition, so that the small-amplitude high level (h) of the signal "Ib" on the signal line B2 is forcibly pulled down. As mentioned hereinbefore, since the current supplying capability of the transistors N31 to N34 is sufficiently larger than that of the amplifier A1, the signal "Ib" on the signal line B2 is forcibly pulled down to the normal low level (L) which is lower than the small-amplitude low level (l).

On the other hand, the transistor N34 receiving at its gate the normal low level (L) of the inverted test discrimination result signal "It", is put in a non-conductive condition, and therefore, the level of the signal "b" on the signal line B1 is subjected to no influence, and accordingly, maintains the small-amplitude low level (l). As a result, at the complementary inputs "b" and "Ib" of the amplifier A2, the normal low level (L) is smaller than the small-amplitude low level (l), and therefore, the large-and-small relation between the complementary inputs "b" and "Ib" of the amplifier A2 is inverted, in comparison with the case of outputting the normal-data signal. Thus, the output circuit 6 outputs the output signal "e" of the normal low level (L).

Alternatively, as shown in FIG. 4B, it is assumed that when the normal-data signal is selected, the signals "b" and "Ib" is at a small-amplitude high level (h) and at a small-amplitude low level (l), respectively, in the contrary to the case shown in FIG. 4A. If the test selection signal "Im" is brought to the normal high level (H) at a timing T0, the signal "b" on the signal line B1 is maintained at the small-amplitude high level (h), and on the other hand, the signal "Ib" on the signal line B2 is pulled down from the small-amplitude low level (l) to the normal low level (L).

Accordingly, the large-and-small relation between the complementary inputs "b" and "Ib" of the amplifier A2 does not change, and therefore, the output signal "e" of the output signal 6 maintains the normal low level (L).

Namely, at the time of selecting the testing, the level of the output signal "e" is determined by the level of the test discrimination result signal "t", independently of the level of the signals "b" and "Ib" outputted on the lines B1 and B2 from the amplifier A1 in response to the normal-data signals "a" and "Ia".

Figure 5:
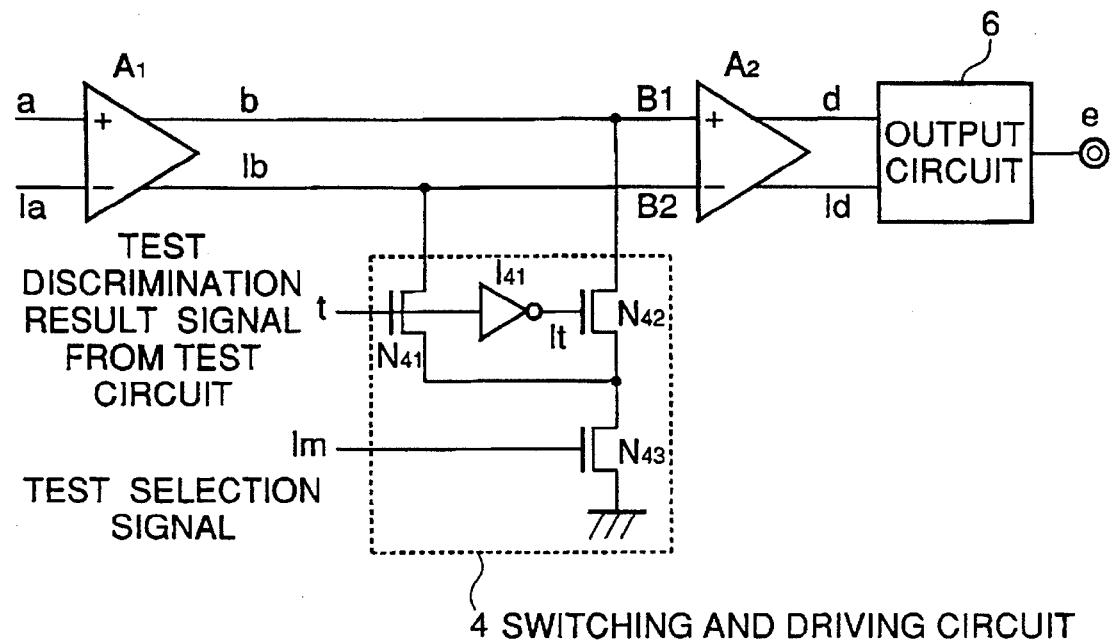
FIG. 5 is a block diagram of a second embodiment of the signal line switching circuit in accordance with the present invention.

Now, referring to FIG. 5, there is shown a block diagram of a second embodiment of the signal line switching circuit in accordance with the present invention. In FIG. 5, elements similar or corresponding to those shown in FIG. 3 are given the same Reference Numerals, and explanation thereof will be omitted for simplification of the description.

As seen from comparison between FIGS. 3 and 5, the second embodiment includes a switching and driving circuit 4 in place of the switching and driving circuit 3. The switching and driving circuit 4 includes an NMOS transistor N41 having its gate connected to receive the test discrimination result signal "t" and its drain connected to the signal line B2, an inverter I41 having its input connected to receive the test discrimination result signal "t" and its output for generating an inverted signal "It" of the test discrimination result signal "t", an NMOS transistor N42 having its gate connected to receive the inverted test discrimination result signal "It", its drain connected to the signal line B1, and its source connected to a source of the NMOS transistor N41, and a source-grounded NMOS transistor N43 having its gate connected to receive the test selection signal "Im" and its drain connected to the sources of the NMOS transistors N41 and N42. Similarly to the transistors N31 to N34 of the first embodiment, transistors N41 to N43 have a current supplying capability sufficiently larger than that of the amplifier A1. For example, the current supplying capability of the transistors N41 to N43 is not smaller than a double of the current supplying capability of the amplifier A1.

Operation of the second embodiment is similar to that of the first embodiment, excepting that the switching transistor means controlled by the test selection signal "Im" so as to supply the test discrimination result signal against the signals "b" and "Ib" on the signal lines B1 and B2 is constituted of only one common transistor N43. Therefore, when the test selection signal "Im" is at the normal high level (H), the level of the output signal "e" is determined by the level of the test discrimination result signal "t", independently of the level of the signals "b" and "Ib" outputted on the lines B1 and B2 from the amplifier A1 in response to the normal-data signals "a" and "Ia".

Figure 6:
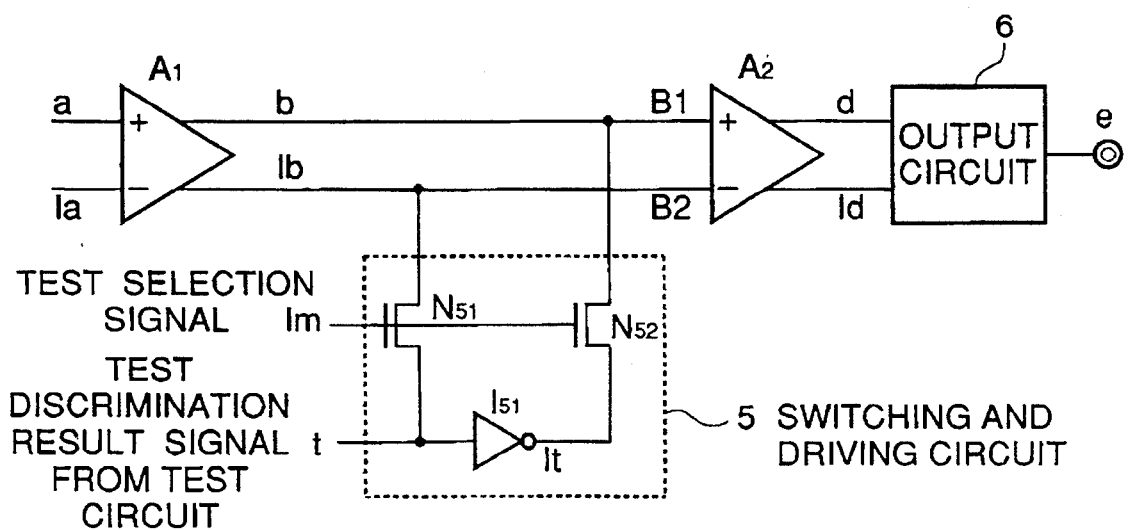
FIG. 6 is a block diagram of a third embodiment of the signal line switching circuit in accordance with the present invention.

Referring to FIG. 6, there is shown is a block diagram of a third embodiment of the signal line switching circuit in accordance with the present invention. In FIG. 6, elements similar or corresponding to those shown in FIG. 3 are given the same Reference Numerals, and explanation thereof will be omitted for simplification of the description.

As seen from comparison between FIGS. 3 and 6, the third embodiment includes a switching and driving circuit 5 in place of the switching and driving circuit 3. The switching and driving circuit 5 includes a pair of NMOS transistors N51 and N52 having their gate connected in common to receive the test selection signal "Im" and their drain connected to the signal lines B2 and B1, respectively, and an inverter I51 having its input connected to receive the test discrimination result signal "t" and also connected to a source of the transistor N51 and its output for generating an inverted signal "It" of the test discrimination result signal "t" and also connected to a source of the transistor N52. Similarly to the transistors N31 to N34 of the first embodiment, the transistors N51 and N52 and the inverter 151 have a current supplying capability sufficiently larger than that of the amplifier A1. For example, the current supplying capability of the transistors N51 and N52 and the inverter 151 is not smaller than a double of the current supplying capability of the amplifier A1.

Operation of the third embodiment is similar to that of the first and second embodiments, excepting that the test discrimination result signal "t" and its inverted signal "It" are supplied through the transistors N51 and N52 directly or without modification to the signal lines B2 and B1, respectively. Therefore, when the test selection signal "Im" is at the normal high level (H), the level of the output signal "e" is determined by the level of the test discrimination result signal "t", independently of the level of the signals "b" and "Ib" outputted on the lines B1 and B2 from the amplifier A1 in response to the normal-dam signals "a" and "Ia".

The present invention has thus been shown and described with reference to the specific embodiments. However, it should be noted that the present invention is in no way limited to the details of the illustrated structures of the embodiments but changes and modifications may be made within the scope of the appended claims. For example, a PMOS (P-channel metal-oxide-semiconductor field effect) transistor can be used in place of each NMOS transistor used in the switching circuits 3, 4 and 5.

As seen from the above, the signal line switching circuit in accordance with the present invention is characterized by comprising a switching and driving circuit connected in parallel to a pair of complementary signal lines to be switch-controlled and having a current supply capability sufficiently larger than that of an amplifier having its pair of complementary outputs connected to the pair of complementary signal lines so as to output a pair of complementary normal-data signals onto the pair of complementary signal lines, the switching and driving circuit being capable of supplying onto at least one of the pair of complementary signal lines a signal which is independent of a level of the outputs of the amplifier and which corresponds to a test discrimination result signal.

Accordingly, since no active circuit element generating any additional delay is inserted in series in a signal transmission path of the pair of complementary normal-data signals outputted from the amplifier, it is possible to remove a cause for lowering the signal transmission speed when the normal-data signal is selected. In addition, since relatively small size NMOS transistors can be used, and since the number of signal lines for supplying the normal-data/test selection signal and the test discrimination result signal to the switching circuit can be halved, it is possible to reduce the chip size.

I claim:

1. A signal line switching circuit comprising:
    a first amplifying circuit receiving a data signal for outputting first and second signals complementary to each other and having a first amplitude, onto first and second signal lines, respectively;
    a second amplifying circuit receiving said first and second signals on said first and second signal lines, for outputting a pair of complementary output signals having a second amplitude; and
    a switching and driving circuit connected in parallel to said first and second signal lines, and receiving a test discrimination result signal and responding to a test selection signal indicative of selection of a test operation, so as to supply on said first and second signal lines, third and fourth signals complementary to each other and corresponding to said test discrimination result signal;
    said switching and driving circuit having a current supply capacity larger than that of said first amplifying circuit as to be able to supply said third and fourth signals onto said first and second signal lines, respectively, independently of the level of said first and second signals.

2. The signal line switching circuit as claimed in claim 1 wherein:
    said switching and driving circuit includes:
    first and second MOS transistors having their respective gates connected in common to receive said test selection signal and their respective drains connected to said first and second signal lines, respectively;
    a third MOS transistor having its gate connected to receive said test discrimination result signal, its drain connected to a source of said first MOS transistor, and its source connected to a voltage supply voltage;
    an inverter having its input connected to receive said test discrimination result signal and its output for generating an inverted signal of said test discrimination result signal; and
    a fourth MOS transistor having its gate connected to said output of said inverter, its drain connected to a source of said second MOS transistor, and its source connected to said voltage supply voltage; and
    said first to fourth MOS transistors have a current supplying capability larger than that of said first amplifying circuit.

3. The signal line switching circuit as claimed in claim 2, wherein said current supplying capability of said first to fourth MOS transistors is not smaller than twice the current supplying capability of said first amplifying circuit.

4. The signal line switching circuit as claimed in claim 1, wherein:
    said switching and driving circuit includes:
    a first MOS transistor having its gate connected to receive said test discrimination result signal and its drain connected to said second signal line;
    an inverter having its input connected to said test discrimination result signal and its output for generating an inverted signal of said test discrimination result signal;
    a second MOS transistor having its gate connected to receive said inverted test discrimination result signal, its drain connected to said first signal line; and
    a third MOS transistor having its gate connected to receive said test selection signal, its drain connected to a source of each of said first and second MOS transistors, and its source connected to a voltage supply voltage; and
    said first to third MOS transistors have a current supplying capability larger than that of said first amplifying circuit.

5. The signal line switching circuit as claimed in claim 4, wherein said current supplying capability of said first to third MOS transistors is not smaller than twice the current supplying capability of said first amplifying circuit.

6. The signal line switching circuit as claimed in claim 1, wherein:
    said switching and driving circuit includes:

first and second MOS transistors having their respective gates connected in common to receive said test selection signal and their respective drains connected to the first and second signal lines, respectively; and an inverter having its input connected to receive said test discrimination result signal and also connected to a source of said first MOS transistor and its output for generating an inverted signal of said test discrimination result signal and also connected to a source of said second MOS transistor;

said first and second MOS transistors and said inverter have a current supplying capability larger than that of said first amplifying circuit.

7. The signal line switching circuit as claimed in claim 6, wherein said current supplying capability of said first and second MOS transistors and said inverter is not smaller than twice the current supplying capability of said first amplifying circuit.

* * * * *